US012648425B2

(12) United States Patent
Anderson et al.

(10) Patent No.: US 12,648,425 B2
(45) Date of Patent: Jun. 2, 2026

(54) FLEXIBLE MOL AND/OR BEOL STRUCTURE

(71) Applicant: International Business Machines Corporation, Armonk, NY (US)

(72) Inventors: Brent A. Anderson, Jericho, VT (US); Albert M. Chu, Nashua, NH (US); Nicholas Anthony Lanzillo, Wynantskill, NY (US); Lawrence A. Clevenger, Saratoga Springs, NY (US); Reinaldo Vega, Mahopac, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 677 days.

(21) Appl. No.: 18/083,818

(22) Filed: Dec. 19, 2022

(65) Prior Publication Data

US 2024/0203870 A1 Jun. 20, 2024

(51) Int. Cl.
| | |
|---|---|
| *H01L 23/522* | (2006.01) |
| *H10D 30/63* | (2025.01) |
| *H10W 20/00* | (2026.01) |
| *H10W 20/42* | (2026.01) |

(52) U.S. Cl.
CPC ............ *H10W 20/42* (2026.01); *H10D 30/63* (2025.01); *H10W 20/056* (2026.01); *H10W 20/062* (2026.01); *H10W 20/081* (2026.01)

(58) Field of Classification Search
CPC ........... H01L 23/5226; H01L 21/76802; H01L 21/7684; H01L 21/76877; H01L 21/76885; H01L 21/76897; H10D 30/63
See application file for complete search history.

(56) References Cited

U.S. PATENT DOCUMENTS

| | | | |
|---|---|---|---|
| 7,071,099 | B1 | 7/2006 | Greco et al. |
| 7,187,084 | B2 | 3/2007 | Jang et al. |
| 7,229,921 | B2 | 6/2007 | Hironaga et al. |
| 8,357,609 | B2 | 1/2013 | Ryan |
| 8,900,990 | B2 | 12/2014 | Zhang et al. |
| 9,230,906 | B2 | 1/2016 | Schulz et al. |
| 10,319,908 | B2 | 6/2019 | Narayanan et al. |

(Continued)

OTHER PUBLICATIONS

IMEC, "Imec demonstrates semi-damascene interconnects with fully self-aligned vias at 18nm metal pitch", printed on Dec. 16, 2022, 15 pages https://www.imec-int.com/en/articles/imec-demonstrates-semi-damascene-interconnects-fully-self-aligned-vias-18nm-metal-pitch.

*Primary Examiner* — Karen Kusumakar

(74) *Attorney, Agent, or Firm* — Scully, Scott, Murphy & Presser, P.C.; Kimberly Zillig

(57) ABSTRACT

A semiconductor structure is provided that includes a MOL and/or BEOL structure for low resistance, low capacitance and design flexibility. The structure includes a first metal level including a plurality of first metal lines and a plurality of first metal vias located at same level within a first interlayer dielectric material layer, and a second metal level located above the first metal level. The second metal level includes a plurality of second metal lines and a plurality of second metal vias located at a same level within a second interlayer dielectric material layer. The first metal level is formed utilizing a damascene process and the second metal level is formed utilizing a substrative etch. A single metallization is used to provide the first and second metal levels.

16 Claims, 4 Drawing Sheets

(56) References Cited

U.S. PATENT DOCUMENTS

| | | | |
|---|---|---|---|
| 11,094,580 | B2 | 8/2021 | Park et al. |
| 11,302,575 | B2 | 4/2022 | Anderson et al. |
| 2020/0381346 | A1 * | 12/2020 | Chen ................... H01L 21/4857 |
| 2021/0313217 | A1 * | 10/2021 | Kumar ................ H01L 23/5226 |
| 2021/0335661 | A1 * | 10/2021 | Chen ................. H01L 21/76831 |
| 2022/0139823 | A1 | 5/2022 | Lin et al. |
| 2022/0262723 | A1 | 8/2022 | Bao et al. |

* cited by examiner

FLEXIBLE MOL AND/OR BEOL STRUCTURE

BACKGROUND

The present application relates to semiconductor technology, and more particularly to a middle-of-the-line (MOL) and/or back-end-of-the-line (BEOL) structure for low resistance, low capacitance and design flexibility.

In the manufacturing of integrated circuits (ICs), devices are formed on a wafer and connected by conductive interconnect layers. These conductive interconnect layers can be formed during so-called MOL processes or BEOL processes. MOL and BEOL processes are similar in that these processes both form openings in an interlayer dielectric layer (e.g. contact holes, trenches, or via holes in the interlayer dielectric layer), and then fill these openings with a conductive material. MOL differs from BEOL in that the MOL typically occurs earlier in the fabrication process, and may refer to the process of forming contacts directly on, or close to, device structures such as a gate electrode or a source/drain region; whereas BEOL typically occurs later in the fabrication process, and may refer to the process of forming successive metallization layers and vias above the contacts formed by MOL.

SUMMARY

A semiconductor structure is provided that includes a MOL and/or BEOL structure for low resistance, low capacitance and design flexibility. The MOL and/or BEOL structure includes a first metal level including a plurality of first metal lines and a plurality of first metal vias located at same level within a first interlayer dielectric material layer, and a second metal level located above the first metal level. The second metal level includes a plurality of second metal lines and a plurality of second metal vias located at a same level within a second interlayer dielectric material layer. The first metal level is formed utilizing a damascene process and the second metal level is formed utilizing a substractive etch. A single metallization is used to provide the first and second metal levels.

In one aspect of the present application, a semiconductor structure is provided. In one embodiment, the semiconductor structure includes a first metal level including a plurality of first metal lines and a plurality of first metal vias located at same level within a first interlayer dielectric material layer. The semiconductor structure further includes a second metal level located above the first metal level, the second metal level includes a plurality of second metal lines and a plurality of second metal vias located at a same level within a second interlayer dielectric material layer. In accordance with the present application, each of the first metal vias in the first metal level is in direct physically contact with one of the second metal lines or one of the second metal vias in the second metal level. The first and second metal levels provide a MOL structure that has a low resistance, low capacitance and design flexibility.

In another aspect of the present application, method of forming a semiconductor structure is provided. In one embodiment, the method includes forming a plurality of first line openings and a plurality of first via openings in a first interlayer dielectric material layer. An electrically conductive material is then formed in each of the plurality of first line openings and the plurality of first via openings to provide a plurality of first metal lines and a plurality of first metal vias at a same level within the first interlayer dielectric material layer, wherein a portion of the electrically conductive material extends above each of the plurality of first line openings and the plurality of first via openings and on top of the first interlayer dielectric material layer. A subtractive etch is then performed on the portion of the electrically conductive material that extends above each of the plurality of first line openings and the plurality of first via openings and on top of the first interlayer dielectric material layer to provide a plurality of second metal lines and a plurality of second metal vias located at a same level. Next, a second interlayer dielectric material layer is formed on the first interlayer dielectric material layer and laterally adjacent to each of the plurality of second metal lines and the plurality of second metal vias.

DETAILED DESCRIPTION

Figure 1:
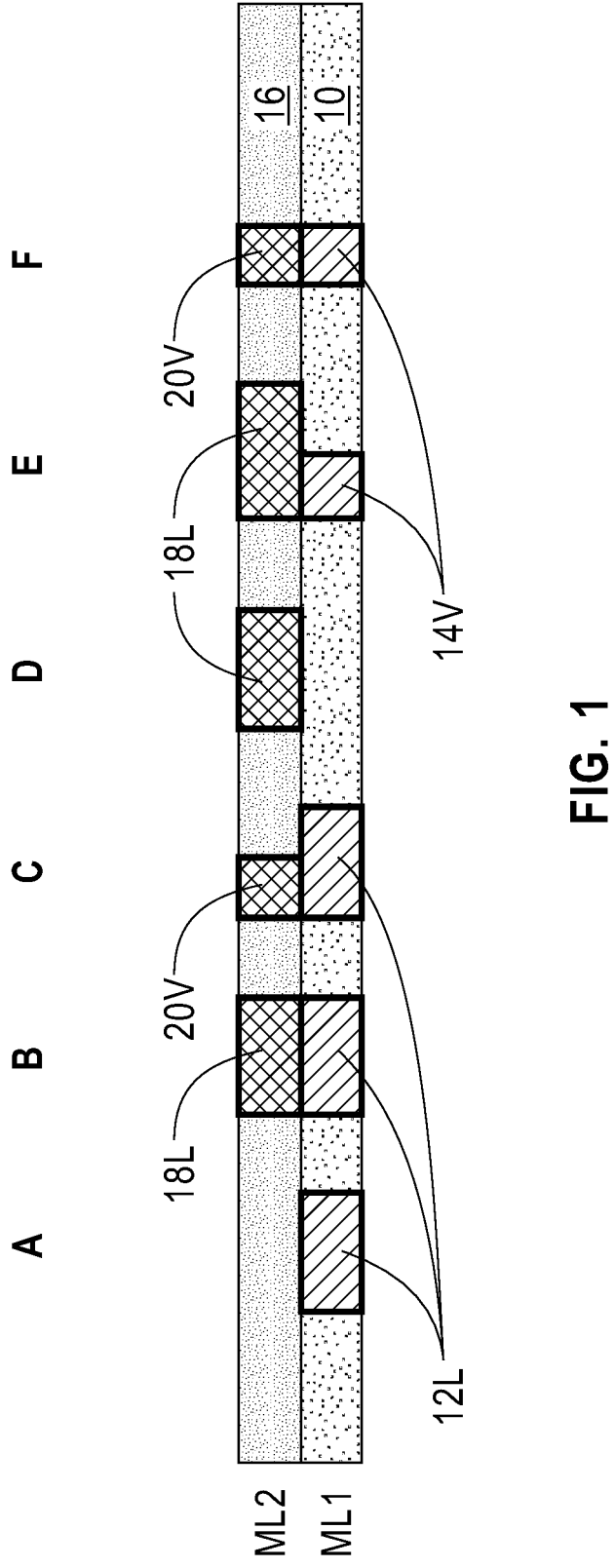
FIG. 1 is a cross sectional view of an exemplary semiconductor structure in accordance with an embodiment of the present application.
Figures 2A, 2B, 2C, 2D:
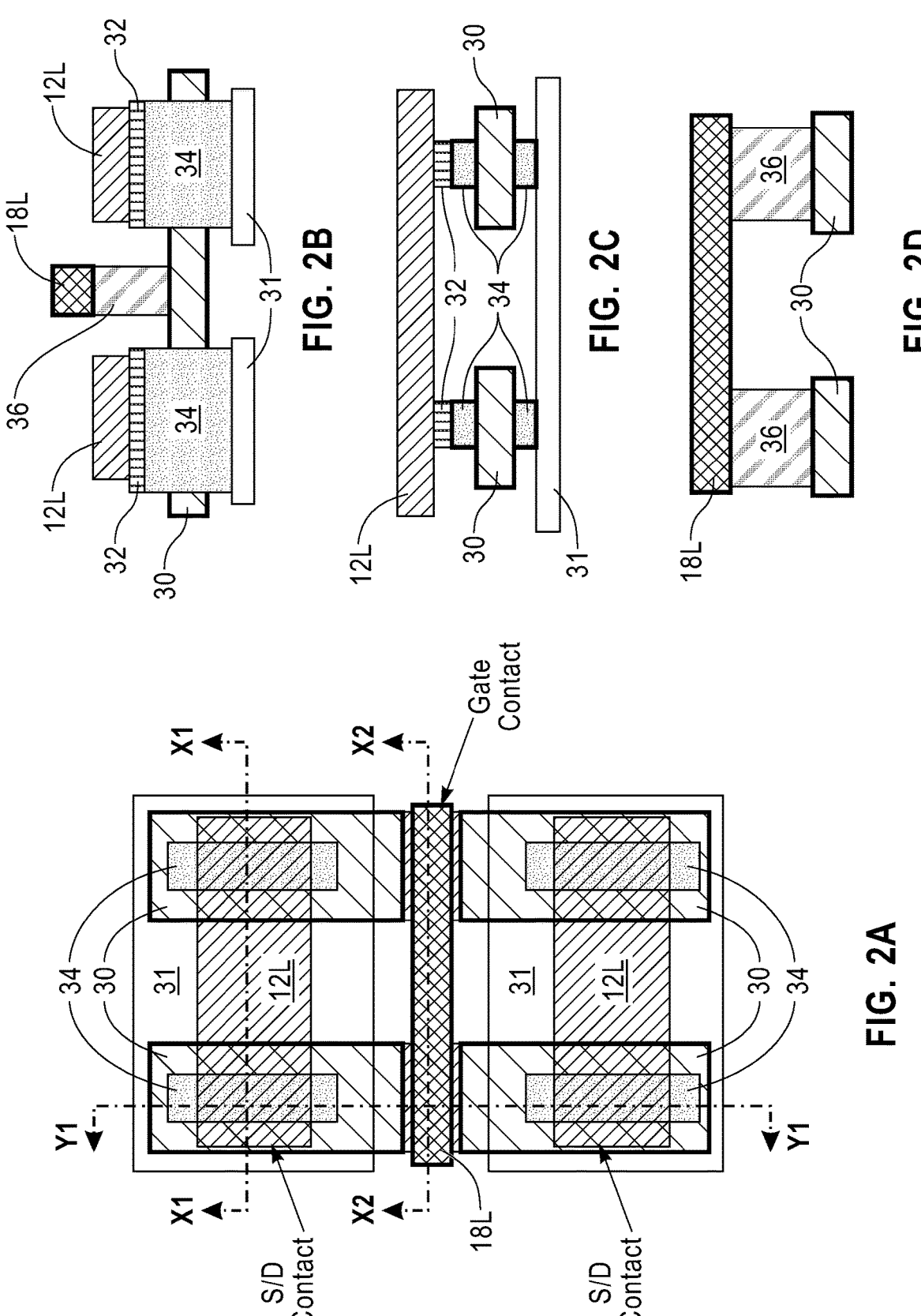
FIG. 2A is a top down view illustrating an exemplary embodiment of the present application in which the semiconductor structure can be used to provide source/drain contact structures, and gate contact structures.
FIG. 2B is a cross sectional view of the exemplary embodiment through cut Y-Y shown in FIG. 2A.
FIG. 2C is a cross sectional view of the exemplary embodiment through cut X1-X1 shown in FIG. 2A.
FIG. 2D is a cross sectional view of the exemplary embodiment through cut X2-X2 shown in FIG. 2A.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Reference is first made to FIG. 1, which illustrates an exemplary semiconductor structure in accordance with an embodiment of the present application. As is illustrated, the semiconductor structure includes a first metal level, ML1, including a plurality of first metal lines 12L and a plurality of first metal vias 14V located at same level within a first interlayer dielectric material layer 10. The semiconductor structure further includes a second metal level, ML2, located above the first metal level, ML1. The second metal level, ML2, includes a plurality of second metal lines 18L and a plurality of second metal vias 20V located at a same level within a second interlayer dielectric material layer 16. In accordance with the present application, each of the first metal vias 14V in the first metal level, ML1, is in direct physically contact with one of the second metal lines 18L or one of the second metal vias 20V in the second metal level, ML2. In embodiments of the present application and as is illustrated in FIG. 1, at least a portion of at least one of the first metal lines 12L in the first metal level, ML1, is covered by the second interlayer dielectric material layer 16. In some embodiments, an entirety of at least one of the first metal lines 12L in the first metal level, ML1, is covered by the second interlayer dielectric material layer 16. The first and second metal levels, ML1, ML2, illustrated in FIG. 1 provide a MOL and/or BEOL structure that has a low resistance, low capacitance and design flexibility.

As is illustrated in FIG. 1, the plurality of first metal lines 12L, the plurality of first metal vias 14V and the first interlayer dielectric material layer 10 have topmost surfaces that are coplanar with each other, and the plurality of second metal lines 18L, the plurality of second metal vias 20V and the second interlayer dielectric material layer 16 have topmost surfaces that are coplanar with each other. As is further shown in FIG. 1, the plurality of second metal lines 18L and the plurality of second metal vias 20V extend entirely through the second interlayer dielectric material layer 16.

The exemplary structure shown in FIG. 1 can include six different regions which are labeled as A, B, C, D, E and F in FIG. 1. It is noted that the exemplary structure does not require that all of the these different regions are present on a same chip or wafer. These different regions illustrate the design flexibility of the exemplary structure of the present application. Notably, region A illustrates a region in which the second interlayer dielectric material 16 entirely covers a first metal line 12L. Region B illustrates a region in which a second metal line 18L is located directly on top of a first metal line 12L. In this region, the size of the second metal line 18L does not need to match the size of the first metal line 12L. Also, and in this region, the second metal line 18L can be wider or narrower and can run orthogonal to the first metal line 12L. Region C illustrates a region in which a second metal via 20V is located directly on top of a first metal line 12L (in Region C, the first metal line 12L is partially covered by the second metal via 20V and partially covered by the second interlayer dielectric material layer 16). Region D illustrates a region in which a second metal line 18L is located directly over a portion of the first interlayer dielectric material layer 10; in this region the second metal line 18L is not contacting any first metal line 12L or any first metal via 14V. Region E is a region in which a second metal line 18L is partially located on a first metal via 14V and partially on the first interlayer dielectric material layer 10. Region F denotes a region in which a second metal via 20V is located directly on a first metal via 14V.

In Region B, the first metal line 12L and the second metal line 18L that is located directly on top of the first metal line 12L provides a first metal line-to-second metal line structure that is composed of a uniform constructed and single piece electrically conductive material. Thus, no diffusion barrier liner and/or metal liner is present between these two vertically stacked metal lines that are present in Region B.

In Region C, the first metal line 12L and the second metal via 20V that is located directly on top of the first metal line 12L provides a first metal line-to-second metal via structure that is composed of a uniform constructed and single piece electrically conductive material. Thus, no diffusion barrier liner and/or metal liner is present between these two stacked metal structures that are present in Region C.

In Region E, the first metal via 14V and the second metal line 18L that is located directly on top of the first metal via 14V provides a first metal via-to-second metal line structure that is composed of a uniform constructed and single piece electrically conductive material. Thus, no diffusion barrier liner and/or metal liner is present between these two stacked metal structures that are present in Region E.

In Region F, the first metal via 14V and the second metal via 20V that is located directly on top of the first metal via 14V provides a first metal via-to-second metal via structure that is composed of a uniform constructed and single piece electrically conductive material. Thus, no diffusion barrier liner and/or metal liner is present between these two vertically stacked metal vias that are present in Region F.

In accordance with the present application, the first interlayer dielectric material layer 10 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). The first interlayer dielectric material layer 10 can be formed by a deposition process such as, for example, chemical vapor deposition (CVD), plasma enhanced chemical vapor deposition (PECVD), or spin-on coating.

The second interlayer dielectric material layer 16 is composed of one of the dielectric materials as mentioned above for first interlayer dielectric material layer 10. The dielectric material that provides the second interlayer dielectric material layer 16 can be compositionally the same as, or compositionally different from, the dielectric material that provides the first interlayer dielectric material layer 10. The second interlayer dielectric material layer 16 can be formed utilizing a deposition process including one of the deposition processes mentioned above in forming the first interlayer dielectric material layer 10.

Each of the first metal lines 12L, the first metal vias 14V, the second metal lines 18L and the second metal vias 20V is composed of an electrically conductive material. Again, and as mentioned above, the vertical stacked metal structures that are present one on top the other are composed of a uniform constructed and single piece electrically conductive material. Thus, the vertically stacked metal structures lack any diffusion barrier and/or metal liners separating the top and bottom metal levels. Illustrative examples of electrically conductive materials that can be used in the present application in providing the first metal lines 12L, the first metal vias 14V, the second metal lines 18L and the second metal vias 20V include, but are not limited to, electrically conductive metals such as W, Cu, Al, Co, Ru, Mo, Os, Ir, Rh, or electrically conductive metal alloys such as, for example, a Cu—Al alloy.

In the present application, the first metal level, ML1, is formed utilizing a damascene process and the second metal level. ML2, is formed utilizing a substrative etch. A single metallization is used to provide the first and second metal levels. This aspect of the present application will be described in greater detail herein below.

In the present application, the plurality of first metal lines 12L and/or the plurality of first metal vias 141V can be used to contact at least one of a lower wiring level, device source/drain regions, contact structures, and/or gate electrodes of a gate structure that also includes a gate dielectric material layer.

Reference is now made to FIGS. 2A-2D, which illustrate an exemplary embodiment of the present application in which the semiconductor structure of the present application can be used to provide source/drain contact structures, and gate contact structures. In the exemplary embodiment, the semiconductor structure of the present application is used as a flexible MOL structure having a low resistance and a low capacitance. This example shows how a top source/drain region of a vertical transistor can be connected by the first metal line 12L at the first metal level and the gate electrode of the vertical transistor can be connected by second metal line 18L at the second metal level. By placing these wires at different metal levels, the capacitance between the first metal line 12L and the second metal line 18L is reduced while keeping the resistance low.

In this exemplary embodiment, a plurality of transistors are located beneath the first metal level, ML1, wherein each transistor of the plurality of transistors includes a gate electrode 30 and source/drain regions 31, 32, and one of the second metal lines 18L is electrically connected to the gate electrode 30 of each of the plurality of transistors, and one of first metal lines 12L is in direct physical contact with one of the source/drain regions (i.e., top source/drain region 32) of each of the transistors. Although a first metal line 12L and a second metal line 18L are shown as contact structures, the present application contemplates other combinations of first metal lines 12L and/or first metal vias 14V as well as other combinations of second metal lines 18L and/or second metal vias 20V as contact structures. In some embodiments, each of the transistors of the plurality of transistors is a vertical transistor including a semiconductor pillar 34 in which the source/drain regions 31, 32 are located at opposite ends of the semiconductor pillar 34. The semiconductor pillar 34 is a vertical semiconductor channel of the vertical transistors.

In the illustrated embodiment, source/drain region 32 is a top source/drain region of a vertical transistor, while source/drain region 31 is a bottom source/drain region of the vertical transistor. Vertical transistors can also include dielectric spacers (not shown in FIGS. 2A-2D) and contact structure 36. It is noted that the present application is not limited to vertical transistors but instead contemplates using other types of transistors such as, for example, planar transistors, finFET transistors, nanosheet transistors, nanowire transistors or any combination of transistors including a gate electrode and source/drain regions.

The semiconductor material pillar 34 is composed of any semiconductor material having semiconducting properties. Illustrative examples of semiconductor materials that can be used include, but are not limited to, silicon (Si), a silicon germanium (SiGe) alloy, a silicon germanium carbide (Si- GeC) alloy, germanium (Ge), III/V compound semiconductors or II/VI compound semiconductors.

Gate electrode 30 can include a conductive metal and an optional work function metal (WFM). The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the WFM-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The conductive metal that provide the gate electrode can include, but is not limited to, Al, W, or Co. Although not shown, a gate dielectric material such as, for example, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The gate dielectric material can further include dopants such as La, Al and/or Mg, is present between the gate electrode and the semiconductor pillar.

The source/drain regions 31, 32 include a semiconductor material, as defined above, and a dopant. As used herein, a "source/drain or S/D" region can be a source region or a drain region depending on subsequent wiring and application voltage during operation of the transistor. The dopant can be either an n-type dopant or a p-type dopant, both as defined herein below. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of the n-type or p-type dopant in the source/drain regions 31, 32 can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived.

Contact structure 36 is composed of at least a contact conductor material. The contact conductor material can include, for example, a silicide liner, such as Ni, Pt, NiPt, an adhesion metal liner, such as TiN, and conductive metals such as W. Cu, Al, Co, Ru, Mo, Os, Ir, Rh, or an alloy thereof. The contact structure 36 can also include one or more contact liners (not shown). In one or more embodiments, the contact liner (not shown) can include a diffusion barrier material. Exemplary diffusion barrier materials include, but are not limited to, Ti, Ta, Ni, Co. Pt, W. Ru. TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

Figure 3A:
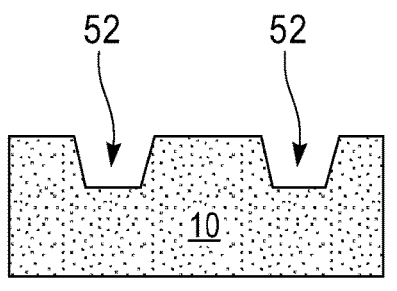
FIGS. 3A-3D are cross sectional views illustrating processing steps that can be employed in the present application.
Figure 3B:
Figure 3C:
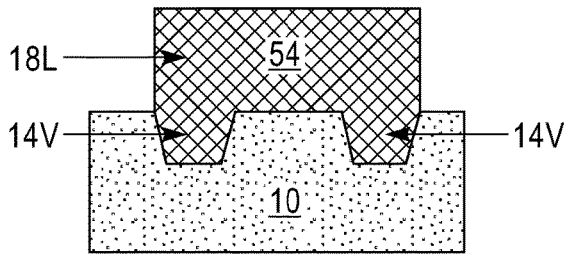
Figure 3D:
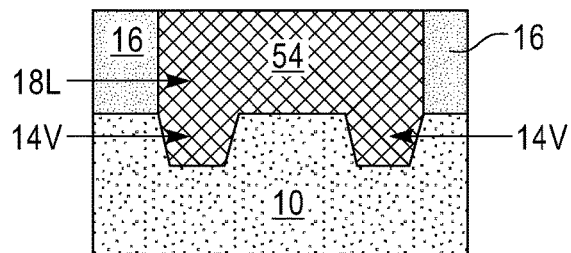
Figure 4A:
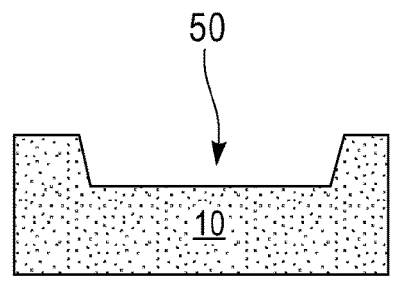
FIGS. 4A-4D are cross sectional views illustrating processing steps that can be employed in the present application.
Figure 4B:
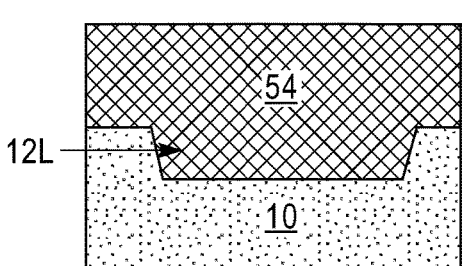
Figure 4C:
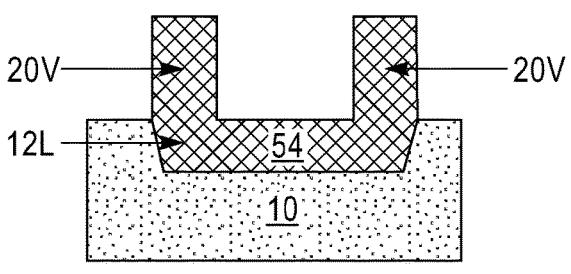
Figure 4D:
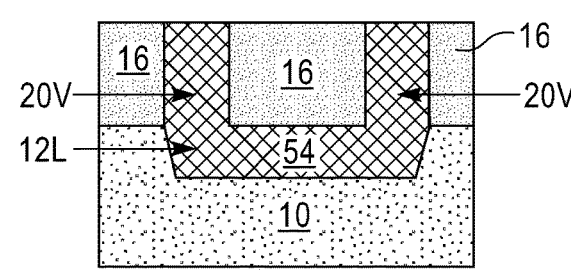
Figure 5A:
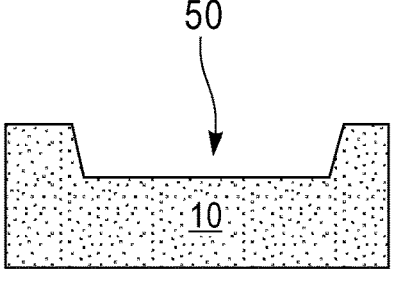
FIGS. 5A-5D are cross sectional views illustrating processing steps that can be employed in the present application.

Referring now to FIGS. 3A-3D, 4A-4D and 5A-5D, there are illustrated processing steps that can be employed in the present application. Notably, FIGS. 3A, 4A and 5A illustrate a first step of forming a plurality of first line openings 50 and a plurality of first via openings 52 in first interlayer dielectric material layer 10. It is noted that while each of FIGS. 3A, 4A and 5A show only one type of opening (i.e., line opening or via opening) being formed into the first interlayer dielectric material layer 10, a plurality of different types of these openings can be formed into the first interlayer dielectric material layer 10 at this point of the present application. These openings are formed by lithography and etching. Lithography includes forming a photoresist material on a material or material stack that needs to be patterned, exposing the as-deposited photoresist material to a pattern of irradiation, and developing the exposed photoresist material.

Figure 5B:
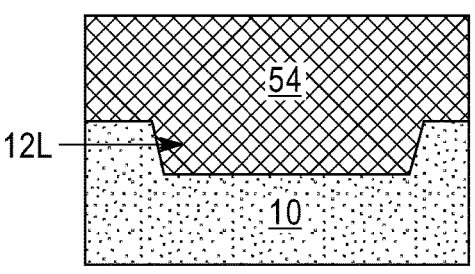

Next, and as is shown in FIGS. 3B, 4B and 5B, an electrically conductive material 54 is formed in each of the plurality of first line openings 50 and the plurality of first via openings 52 to provide a plurality of first metal lines 12L and a plurality of first metal vias 14V at a same level within the first interlayer dielectric material layer 10. This step forms the first metal level. As is shown, a portion of the electrically conductive material 54 extends above each of the plurality of first line openings 50 and the plurality of first via openings 52 and on top of the first interlayer dielectric material layer 10. The step of the present application includes a deposition process such as, for example, CVD, PECVD, physical vapor deposition (PVD), atomic layer deposition (ALD), sputtering or plating. The electrically conductive material 54 includes an electrically conductive metal or electrically conductive metal alloy as defined above. The forming of the openings and subsequent deposition step can be referred to herein as a damascene process.

Figure 5C:
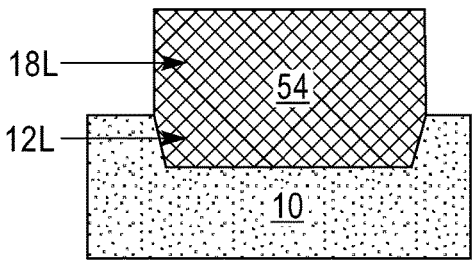

After forming the electrically conductive material 54, and as is shown in FIGS. 3C, 4C and 5C, a subtractive etch is performed on the overburden portion of the electrically conductive material 54 that extends above each of the plurality of first line openings 50 and the plurality of first via openings 52 and on top of the first interlayer dielectric material layer 10. This substrative etch provides a plurality of second metal lines 18L and a plurality of second metal vias 20V located at a same level. The subtractive etch includes lithography and an etch that is selective in removing the electrically conductive material 54. Note that the stacked metal features are composed of a uniform constructed and single piece electrically conductive material (i.e., the remaining portion of electrically conductive material 54 shown in FIGS. 3C, 4C and 5C).

Figure 5D:
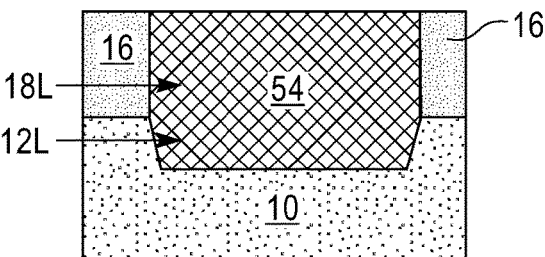

Next and as shown in FIGS. 3D, 4D and 5D, the second metal level is formed by forming second interlayer dielectric material layer 16 on the first interlayer dielectric material layer 10 and laterally adjacent to each of the plurality of second metal lines 18L and the plurality of second metal vias 20V. The step includes deposition of the dielectric material that provides the second interlayer dielectric material layer 16, followed by a planarization process such as, for example, chemical mechanical polishing (CMP).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first metal level comprising a plurality of first metal lines and a plurality of first metal vias located at same level within a first interlayer dielectric material layer, wherein the plurality of first metal lines has a topmost surface that is coplanar with a topmost surface of the plurality of first metal vias and a topmost surface of the first interlayer dielectric material layer; and
a second metal level located directly above, and in direct physical contact with, the first metal level, the second metal level comprising a plurality of second metal lines and a plurality of second metal vias located at a same level within a second interlayer dielectric material layer, each second metal via of the plurality of second metal vias has a topmost surface that is coplanar with a topmost surface of each second metal line of the plurality of second metal lines and with a topmost surface of the second interlayer dielectric material layer, and wherein each of the first metal vias in the first metal level is in direct physically contact with either one of the second metal lines providing a first metal via-to-second metal line structure composed of a uniform constructed and single piece electrically conductive material, or with one of the second metal vias in the second metal level providing a first metal via-to-second metal via structure that is composed of a uniform constructed and single piece electrically conductive material.

2. The semiconductor structure of claim 1, wherein at least a portion of at least one of the first metal lines in the first metal level is covered by the second interlayer dielectric material layer.

3. The semiconductor structure of claim 2, wherein at least another portion of least one of the first metal lines in the first metal level is in direct physical contact with one of the second metal vias in the second metal level.

4. The semiconductor structure of claim 1, wherein an entirety of at least one of the first metal lines in the first metal level is covered by the second interlayer dielectric material layer.

5. The semiconductor structure of claim 1, wherein at least one of the second metal lines in the second metal level is located directly on a surface of the first interlayer dielectric material layer.

6. The semiconductor structure of claim 1, wherein at least one of the second metal lines in the second metal level is located directly on a surface of one of first metal lines present in the first interlayer dielectric material layer.

7. The semiconductor structure of claim 1, wherein at least one of the second metal lines of the plurality of second metal lines is formed on top of one of the first metal lines of the plurality of first metal lines.

8. The semiconductor structure of claim 1, wherein at least one of the second metal vias of the plurality of second metal vias is formed directly on top of one of the first metal lines of the plurality of first metal lines.

9. The semiconductor structure of claim 1, wherein each of the first metal vias in the first metal level is in direct physically contact with one of the second metal vias.

10. The semiconductor structure of claim 8, wherein the plurality of second metal lines and the plurality of second metal vias extend entirely through the second interlayer dielectric material layer.

11. The semiconductor structure of claim 1, further comprising:

a plurality of transistors located beneath the first metal level, wherein each transistor of the plurality of transistors comprises a gate electrode and source/drain regions, and wherein one of the second metal lines is electrically connected to the gate electrode of each of the plurality of transistors, and one of first metal lines is in direct physical contact with one of the source/drain regions of each of the transistors.

12. The semiconductor structure of claim 11, wherein each of the transistors of the plurality of transistors is a vertical transistor comprising a semiconductor pillar in which the source/drain regions are located at opposite ends of the semiconductor pillar.

13. A method of forming a semiconductor structure, the method comprising:

forming a plurality of first line openings and a plurality of first via openings in a first interlayer dielectric material layer;

forming an electrically conductive material in each of the plurality of first line openings and the plurality of first via openings to provide a plurality of first metal lines and a plurality of first metal vias at a same level within the first interlayer dielectric material layer, wherein a portion of the electrically conductive material extends above each of the plurality of first line openings and the plurality of first via openings and on top of the first interlayer dielectric material layer;

performing a subtractive etch on the portion of the electrically conductive material that extends above each of the plurality of first line openings and the plurality of first via openings and on top of the first interlayer dielectric material layer to provide a plurality of second metal lines and a plurality of second metal vias located at a same level; and forming a second interlayer dielectric material layer on the first interlayer dielectric material layer and laterally adjacent to each of the plurality of second metal lines and the plurality of second metal vias.

14. The method of claim 13, wherein each of the first metal vias is in direct physically contact with one of the second metal lines or one of the second metal vias.

15. The method of claim 14, wherein at least a portion of at least one of the first metal lines is covered by the second interlayer dielectric material layer.

16. The method of claim 15, wherein at least another portion of the least one of the first metal lines is in direct physical contact with one of the second metal lines.

* * * * *